(12) United States Patent
Dalton et al.

(10) Patent No.: US 7,041,596 B1
(45) Date of Patent: May 9, 2006

(54) SURFACE TREATMENT USING IODINE PLASMA TO IMPROVE METAL DEPOSITION

(75) Inventors: Jeremie James Dalton, San Jose, CA (US); Sanjay Gopinath, Fremont, CA (US); Jason M. Blackburn, Santa Clara, CA (US); John Stephen Drewery, Alameda, CA (US)

(73) Assignee: Novellus Systems, Inc., San Jose, CA (US)

( * ) Notice: Subject to any disclaimer, the term of this patent is extended or adjusted under 35 U.S.C. 154(b) by 3 days.

(21) Appl. No.: 10/821,751

(22) Filed: Apr. 8, 2004

(51) Int. Cl.
*H01L 21/4763* (2006.01)

(52) U.S. Cl. ............. 438/650; 438/686; 427/532; 427/535

(58) Field of Classification Search ......... 438/681, 438/643, 393, 758, 686, 769, 650; 427/632, 427/535
See application file for complete search history.

(56) References Cited

U.S. PATENT DOCUMENTS

| | | | |
|---|---|---|---|
| 6,074,945 A * | 6/2000 | Vaartstra et al. | 438/681 |
| 6,146,941 A * | 11/2000 | Huang et al. | 438/253 |
| 6,284,652 B1 | 9/2001 | Charneski | |
| 6,365,486 B1 * | 4/2002 | Agarwal et al. | 438/393 |
| 6,413,864 B1 | 7/2002 | Pyo | |
| 6,468,907 B1 | 10/2002 | Pyo | |
| 6,482,740 B1 * | 11/2002 | Soininen et al. | 438/686 |
| 6,593,236 B1 | 7/2003 | Pyo | |
| 6,605,549 B1 | 8/2003 | Leu | |
| 6,605,735 B1 | 8/2003 | Kawano | |
| 6,613,242 B1 * | 9/2003 | Nakahara et al. | 216/63 |
| 6,613,695 B1 | 9/2003 | Pomarede | |
| 6,638,859 B1 | 10/2003 | Sneh | |
| 6,664,184 B1 * | 12/2003 | Nakahara et al. | 438/650 |
| 6,812,143 B1 * | 11/2004 | Lane et al. | 438/643 |
| 2002/0004293 A1 * | 1/2002 | Soininen et al. | 438/584 |

OTHER PUBLICATIONS

Kwon et al., "Enhancement of Iodine Adsorption Using $I_2$ Plasma for Seedless Catalyst-Enhanced CVD of Copper", Electrochemical and Solid State Letters, 6, (8) C109-C111 (2003), The Electrochemical Society, Inc.

* cited by examiner

*Primary Examiner*—David Zarneke
*Assistant Examiner*—Victor V. Yevsikov
(74) *Attorney, Agent, or Firm*—Thomas Swenson

(57) ABSTRACT

An excited surfactant species is created by generating plasma discharge in a surfactant precursor gas. A surfactant species typically includes at least one of iodine, led, thin, gallium, and indium. A surface of an integrated circuit substrate is exposed to the excited surfactant species to form a plasma-treated surface. A ruthenium thin film is deposited on the plasma-treated surface using a CVD technique.

41 Claims, 6 Drawing Sheets

SURFACE TREATMENT USING IODINE PLASMA TO IMPROVE METAL DEPOSITION

FIELD OF THE INVENTION

The invention is related to the field of chemical vapor deposition of metal in integrated circuit fabrication, in particular to methods for treating an integrated circuit substrate to promote MOCVD or ALD of ruthenium and other metals.

BACKGROUND OF THE INVENTION

The chemical vapor deposition of metal and metal-containing films on dielectric substrates is of great interest in many areas of semiconductor fabrication, such as deposition of metal wiring, electrodes, and diffusion barriers. In particular, thin films of ruthenium, Ru, and ruthenium oxide, $RuO_2$, are useful in integrated circuit devices and in fabrication of integrated circuits. Ruthenium and ruthenium oxide are generally useful as electrical contact materials. They have good electrical conductivity and show good environmental stability. They are useful for contact metallizations, diffusion barriers, and gate metallizations. Ruthenium oxide electrodes have also shown utility as working electrodes in non-aqueous solvents. Ruthenium and ruthenium oxide are useful as capacitor electrodes that remain electrically conductive even after exposure to oxidizing conditions. A thin film of ruthenium metal deposited on a wafer substrate is useful as a seed layer on which copper is deposited by electrochemical or electroless chemical plating techniques.

Deposition of copper wiring in integrated circuits involves a number of processes. Typically, a trench or hole is etched into dielectric material located on a substrate wafer. The hole or trench then is typically lined with one or several adhesion and diffusion-barrier layers; for example, with tantalum nitride, TaN. The hole or trench then is lined with a thin layer of copper, Cu, that acts as a seed layer for electroplated copper. Thereafter, the hole or trench is filled with copper, typically by an electroplating process. In the past, adhesion layers, barrier layers and copper seed layers lining holes and trenches were deposited using conventional physical vapor deposition techniques. As the design density of integrated circuits increases, resulting in smaller dimensions of holes and trenches, it is generally more difficult to use physical vapor deposition to line holes and trenches with uniform and conformal thin films of integrated circuit material.

As the design density of integrated circuits increases, resulting in smaller design features and dimensions, deposition of ruthenium and ruthenium oxide thin films, as well as thin films of other materials, by physical vapor deposition techniques is often unsatisfactory for obtaining good quality, continuous, and conformal thin films. As a result, deposition of ruthenium metal, ruthenium oxide, and other metal compounds by chemical vapor deposition (CVD) and atomic layer deposition (ALD) is important for achieving good circuit quality and acceptable manufacturing yields.

Thus, the chemical vapor deposition of metal films on integrated circuit substrates is of great interest in many areas of semiconductor fabrication. Chemical vapor deposition of metal directly onto a dielectric material, such as silicon oxide, $SiO_2$, or onto standard adhesion layer material, such as tantalum nitride, TaN, is often accompanied by delayed and discontinuous growth, surface roughness and poor adhesion. These problems are especially acute in processes for depositing ruthenium on silicon oxide ($SiO_2$) without a seed layer. Many other metal CVD processes, for example, MOCVD of copper, suffer these problems also.

Techniques are known for improving the nucleation and adhesion of chemical vapor deposition of metallic material onto integrated circuit substrates. For example, U.S. Pat. No. 6,605,549, issued Aug. 12, 2003 to Leu et al., discloses plasma treatment with $O_2$, $N_2O$ or $H_2$ plasma of a dielectric surface prior to CVD or ALD deposition of a barrier film, such as TaN, Ti, TiN, and WTa. U.S. Pat. No. 6,638,859, issued Oct. 28, 2003 to Sneh et al., discloses pretreating a surface using a radical species (e.g., plasma made from $O_2$, $H_2$, OH, $NH_2$, Cl or F) prior to ALD metal deposition to make the substrate surface reactive so that the ALD process can start continuously without nucleation or incubation.

Pretreating a substrate surface with iodine has been reported to increase the growth rate of copper deposited by a MOCVD technique using Cu(hfac)TMVS precursor. U.S. Pat. No. 6,413,864 issued Jul. 2, 2002 to Pyo et al., discloses forming a copper seed layer on a nitride barrier layer surface (e.g., TiN, TaN, WN), then forming a chemical enhancement layer (CE layer) with an iodine-containing liquid compound prior to forming a first copper layer by MOCVD, and then electroplating a second copper layer onto the first copper layer. U.S. Pat. No. 6,468,907 issued Oct. 22, 2002 to Pyo et al., discloses forming a CE layer on a nitride barrier layer surface (e.g., TiN, TaN, WN) with an iodine-containing liquid or gas (or F, Cl, Br, I or At gas), and then removing part of the CE layer prior to filling a damascene pattern with a copper (or Al or W) layer using MOCVD. U.S. Pat. No. 6,593,236 issued Jul. 15, 2003 to Pyo et al., discloses forming a CE layer on a copper seed layer with an iodine-containing liquid or gas (or F, Cl, Br, I or At gas), then removing part of the CE layer by plasma while partially filling a damascene pattern with a copper layer using MOCVD, then electroplating copper. A CE layer of Pyo et al. accelerates or increases the deposition rate of copper onto the CE layer compared to portions of the substrate having no CE layer.

Kwon et al. describe $I_2$ plasma treatment that increases the film growth rate of copper by MOCVD on a $SiO_2$ or TiN surface. "Enhancement of Iodine Adsorption Using $I_2$ Plasma for Seedless Catalyst-Enhanced CVD of Copper", *Electrochemical and Solid-State Letters,* 6 (8) C109–C111 (2003). Other reports in the literature describe the use of surfactants, such as Sb, Pb, CO, $H_2O$, S, and I (iodine), to suppress agglomeration, promote layer-by-layer growth and increase the deposition rate in metal epitaxy. Mechanisms involved are often unclear, but the effects are attributed to a change in surface-diffusion activation energy, leading to a decrease in adatom mobility of the depositing metal in the presence of the surfactant. Adsorption of iodine and some other surfactants onto less-reactive surfaces, such as TiN, TaN and other metal nitrides used for diffusion barriers, and particularly onto nonmetal dielectric surfaces (e.g., $SiO_2$), however, has not been demonstrated to achieve good thin film morphology of ruthenium and of some other metals.

The chemical vapor deposition of metal films on dielectric substrates is often difficult due to the inability of the metal to nucleate on dielectric surface. This leads to long process times, poor adhesion and surface roughness. The deposition of a metal thin film, particularly of ruthenium, Ru, or other Ru-containing layer by chemical vapor deposition (such as MOCVD and ALD) without a metal seed layer often results in poor morphology of the thin film.

SUMMARY OF THE INVENTION

The invention helps to solve some of the problems mentioned above by providing systems and methods for treating a substrate surface to improve CVD deposition of Ru and other metals.

One basic embodiment of a method of depositing a ruthenium thin film in accordance with the invention includes processes of providing a substrate having an untreated dielectric layer, providing an iodine-containing precursor gas, generating a plasma discharge to create excited iodine species from said iodine-containing precursor gas, exposing the dielectric layer to the excited iodine species to form a plasma-treated dielectric layer; and then depositing a ruthenium thin film on the plasma-treated dielectric layer using a CVD technique. In some embodiments, depositing a ruthenium thin film comprises depositing a thin film containing substantially ruthenium atoms. In other embodiments, depositing a ruthenium thin film comprises depositing a thin film containing substantially ruthenium oxide. In some embodiments, depositing a ruthenium thin film on the plasma-treated dielectric layer comprises depositing an ultra-thin ruthenium film having a thickness in a range of about from 1 nanometer (nm) to 20 nm.

Another basic embodiment of a method of depositing a ruthenium thin film by chemical vapor deposition includes processes of providing a substrate having an untreated substrate surface, providing a precursor of a surfactant species, generating a plasma discharge to create an excited surfactant species from the precursor, exposing the untreated substrate surface to the excited surfactant species to form a plasma-treated substrate surface, and then depositing a ruthenium thin film on the plasma-treated substrate surface using a CVD technique. Examples of suitable surfactant species include iodine, lead, tin, gallium, and indium. In certain embodiments, the untreated substrate surface comprises an untreated dielectric layer.

In certain embodiments, an untreated dielectric layer does not comprise metal atoms. Typically, an untreated dielectric layer comprises a silicon-containing dielectric compound; for example, $SiO_2$, BPSG, carbon-doped silicon oxide, CORAL™, nitrogen-doped silicon oxide, SiN, carbon-doped silicon nitride, SiC, and nitrogen-doped silicon carbide. Other examples of an untreated dielectric layer include polymer-based carbon-hydrogen-oxygen-containing dielectric materials having no silicon atoms. In other embodiments, the untreated substrate surface comprises a metal nitride.

Examples of iodine-containing precursor molecules include $I_2$, $C_2H_5I$, $CH_3I$ $CH_2I_2$, $C_2H_4I_2$, and $C_3H_7I$. Examples of other surfactant atoms include lead, tin, gallium, and indium. Examples of corresponding surfactant precursors include bis(2,2,6,6-tetramethyl-3,5-heptanedionato)lead ($Pb(tmhd)_2$), lead (II) hexafluoroacetylacetonate ($Pb(hfac)_2$), $Pb(C_6H_5)_4$ (tetraphenyllead), hexamethylditin, tetra-n-butyltin, tetramethyltin, tin(II)acetylacetonate ($Sn(acac)_2$), tin t-butoxide ($Sn(OC_4H_9)_4$), gallium (III) acetylacetonate ($Ga(acac)_3$), triethylgallium ($Ga(C_2H_5)_3$), cyclopentadienylindium ($C_5H_5In$) and trimethylindium.

In certain embodiments, depositing a ruthenium thin film on the plasma-treated substrate surface comprises using a MOCVD technique. In other embodiments, involves using an ALD technique. In some embodiments, depositing a ruthenium thin film comprises depositing a thin film containing substantially ruthenium atoms. In other embodiments, depositing a ruthenium thin film comprises depositing a thin film containing substantially ruthenium oxide.

Typically, exposing the dielectric layer to the excited iodine species is conducted at low pressure. In some embodiments, depositing a ruthenium thin film on the plasma-treated dielectric layer includes depositing an ultra-thin ruthenium film having a thickness in a range of about from 1 nm to 20 nm.

A generalized, basic embodiment of a method in accordance with the invention of forming a conductive metal-containing integrated circuit structure includes processes of providing a substrate having an untreated substrate surface, providing a precursor of a surfactant species, generating a plasma discharge to create an excited surfactant species from the precursor, exposing the untreated substrate surface to the excited surfactant species to form a plasma-treated substrate surface; then depositing a ruthenium thin film on the plasma-treated substrate surface using a CVD technique; and depositing a second metal layer on the ruthenium thin film.

Examples of suitable surfactant species include iodine, lead, tin, gallium, and indium. Examples of depositing a second metal layer on the ruthenium thin film include depositing a metal selected from the group consisting of copper, aluminum, titanium, and tungsten. An example of depositing a second metal layer on the ruthenium thin film includes electroplating copper on the ruthenium thin film. In some embodiments depositing a ruthenium thin film comprises depositing an ultra-thin ruthenium film having a thickness in a range of about from 1 nm to 20 nm.

A generalized method of slowing the deposition of ruthenium on an integrated circuit substrate comprises providing a substrate having an untreated substrate surface, providing a precursor of a surfactant species, generating a plasma discharge to create an excited surfactant species from the precursor, exposing the untreated substrate surface to the excited surfactant species to form a plasma-treated substrate surface, and then depositing ruthenium on the plasma-treated substrate surface using a CVD technique.

The chemical vapor deposition of metal films on dielectric substrates is of great interest in many areas of semiconductor fabrication, such as deposition of metal wiring, electrodes, and diffusion barriers to protect device elements, such as dielectric and ferroelectric materials in memory capacitors, and copper, aluminum and other conductive materials.

A method in accordance with the invention improves metal deposition on an integrated circuit substrate. Plasma treatment of a substrate surface in accordance with the invention usually reduces the time required for nucleation of metal on the substrate surface during a chemical vapor deposition process, thereby decreasing the nucleation delay of metal growth on the substrate surface. Improved nucleation of metal resulting from plasma treatment in accordance with the invention improves surface morphology of deposited metal, allowing thinner films to be continuous. Further, plasma treatment in accordance with the invention generally decreases the deposition rate of metal onto the plasma-treated surface, thereby improving control of the growth and thickness of metal films, especially ultra-thin films. It is believed that plasma treatment of a surface with excited species (e.g., excited iodine species) in accordance with the invention suppresses the subsequent deposition rate of ruthenium or other metal on the treated surface, resulting in less "island" growth and more uniform layer growth. Plasma treatment of a substrate surface in accordance with the invention improves adhesion of deposited metal to the substrate surface. Improved morphology and greater smoothness of metal deposited in accordance with the invention improves adhesion of materials subsequently formed in contact with the metal. As a result, overall film-stack adhesion is enhanced. Also, thinner barrier layers, electrodes, wiring layers and other metal-containing conductive and nonconductive layers can be deposited on dielectric layers in integrated circuit substrates without necessarily first forming a metal seed layer.

Other features, characteristics and advantages of embodiments in accordance with the invention will become apparent in the detailed description below.

BRIEF DESCRIPTION OF THE DRAWINGS

A more complete understanding of the invention may be obtained by reference to the drawings, in which.

DESCRIPTION OF THE INVENTION

The invention is described herein with reference to FIGS. 1–12. It should be understood that the FIGS. 1–8, depicting integrated circuit devices, are not meant to be actual plan or cross-sectional views of any particular portion of an actual integrated circuit device. In the actual devices, the layers will not be as regular and the thicknesses may have different proportions. The various layers in actual devices often are curved and possess overlapping edges. The figures instead show idealized representations which are employed to explain more clearly and fully the method of the invention than would otherwise be possible. Also, the figures represent only one of innumerable variations of devices that could be fabricated using the method of the invention. Furthermore, processes are described in the specification with reference to FIGS. 1–12; nevertheless, it is clear that methods in accordance with the invention can be practiced using structures, apparati and fabrication processes very different from those of FIGS. 1–12. The preferred embodiments described herein are exemplary and are not intended to limit the scope of the invention, which is defined in the claims below.

Figure 1:
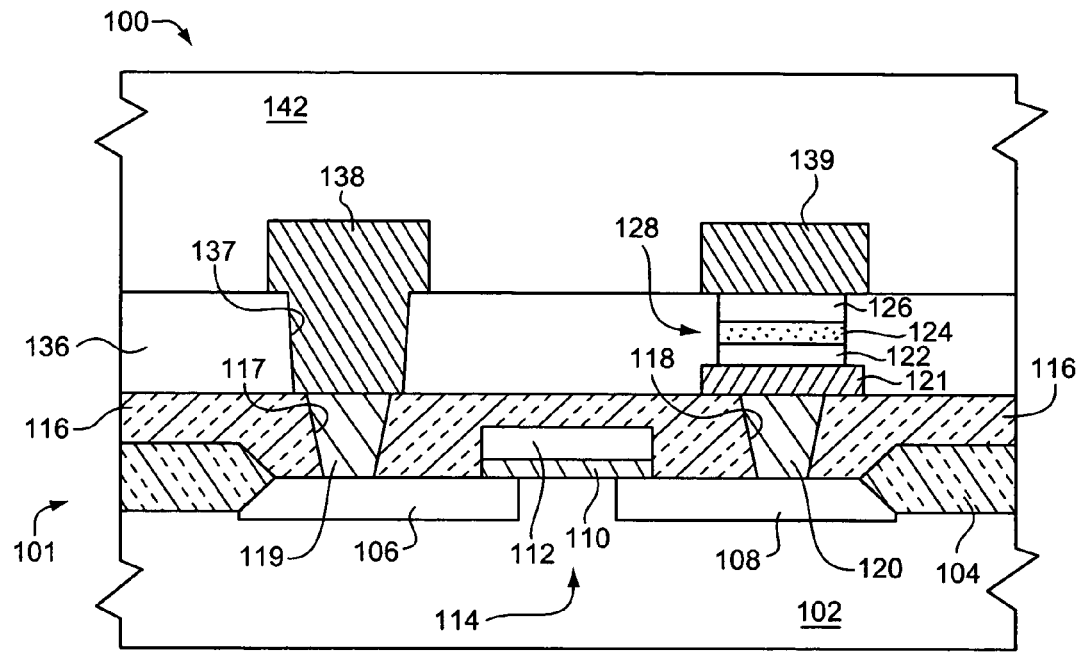
FIG. 1 depicts schematically a cross-sectional view of an exemplary nonvolatile ferroelectric memory comprising ruthenium thin films fabricated in accordance with the invention.

FIG. 1 shows schematically a cross-sectional view 100 of an exemplary nonvolatile ferroelectric memory comprising ruthenium thin films fabricated in accordance with the invention. The general manufacturing steps for fabricating integrated circuits containing MOSFETs and ferroelectric capacitor elements are described in Mihara, U.S. Pat. No. 5,466,629, and Yoshimori, U.S. Pat. No. 5,468,684, which are hereby incorporated by reference as if fully disclosed herein. General fabrication methods have been described in other references also. Therefore, the elements of the circuit of FIG. 1 will be simply identified here.

The terms "injecting", "providing", and related terms used with reference to a gas generally mean the injection of a gaseous precursor of a surfactant species, a carrier gas or another gas into apparatus tubing, a vacuum chamber or a CVD reaction chamber. In some embodiments in accordance with the invention, a process, such as exposing a substrate surface to excited iodine species, is conducted by flowing gas continuously through a vacuum chamber, with gas flowing in at an inlet flow rate and gas flowing out at an outlet flow rate. Typically, a continuous process is conducted at steady-state for at least a portion of the process duration. In other embodiments in accordance with the invention, a process is conducted in a substantially batch mode during at least a portion of the process duration. For example, in some embodiments, a volatile precursor gas is injected into a vacuum chamber to fill the chamber at a particular process pressure, and then the flow of gas is substantially terminated. Therefore, injecting or providing a gas includes continuous flowing of gases as well as non-continuous injection of gases, and the meaning is clear from the context.

The term "proximate" with reference to providing excited surfactant species proximate to a substrate surface and similar contexts is a relative term understood by those skilled in the art. In such context, the term "proximate" means that excited-species gas is present in sufficient concentrations sufficiently close to a surface to activate the substrate surface prior to metal deposition. The ranges of operating pressures and flow rates of surfactant precursor gas and other gasses disclosed in this specification, which generally provide sufficient concentration of excited species proximate to substrate surfaces, are exemplary rather than limiting.

The terms "region" and "area" as used herein generally have their usual meaning; that is, "area" generally designates a two-dimensional surface, whereas a "region" is generally three-dimensional. For example, the term "recessed region" typically refers to an etched-out space in a circuit layer.

The terms "then", "after", "thereafter" and similar terms are used interchangeably in specification to indicate that a particular process or set of processes is conducted sometime after a previous process. These terms do not necessarily signify immediately thereafter.

The term "Ru-containing" refers generally to a chemical species containing one or more ruthenium atoms. The term "Ru-containing", therefore, refers to pure ruthenium metal, as well as to compounds and species that contain ruthenium together with other chemical elements. For example, a ruthenium-containing thin film may comprise pure ruthenium metal, a ruthenium oxide, or another ruthenium-containing compound, depending on the context. The terms "Ru", "ruthenium", "Ru-containing", and similar terms are often used synonymously. For example, the terms "ruthenium precursor", "Ru-containing precursor", and similar terms are used synonymously to mean a precursor compound containing ruthenium atoms that is used in a CVD process to deposit Ru-containing thin film. It is clear, however, that the terms "Ru" and "ruthenium" are also used to refer to substantially pure ruthenium metal.

The term "CVD" and related terms are used broadly in the specification to refer to any chemical deposition methods, apparati, and structures related to a reaction involving one or more gaseous chemical reactants that forms a thin film on a solid substrate surface. As used in its broad sense, therefore, the term "CVD" and related terms also include references to ALD-CVD (or simply ALD) methods, apparati, and structures. The term "CVD" is also used in the specification in a narrower sense to refer to methods, apparati, and structures related to the reaction of one or more gaseous chemical reactants that forms a thin film having a thickness substantially greater than an atomic monolayer formed in an ALD cycle. The meanings of the term "CVD" and related terms are clear from the context in which the terms are used. CVD techniques for depositing thin films of ruthenium, ruthenium oxide and other metal-containing and non-metal-containing species typically utilize a hot-substrate hot-wall reactor apparatus to avoid condensation of reactant precursors prior to their decomposition at the substrate surface. Nevertheless, various suitable reaction apparati also include cold-wall/hot-substrate reactors, radiation beam reactors, and plasma-and photo-assisted CVD reactors, including ALD apparati.

Techniques for depositing ruthenium metal, ruthenium oxide, and other ruthenium compounds by CVD and ALD have been developed for forming thin films on a surface of a semiconductor substrate or substrate assembly, such as a silicon wafer. For example, U.S. Pat. No. 6,074,945, issued Jun. 13, 2000, to Vaartstra et al., U.S. Pat. No. 5,372,849, issued Dec. 13, 1994, to McCormick et al., and U.S. Patent Application Publication No. U.S. 2003/0037802 A1, published Feb. 27, 2003, naming Nakahara et al., which are hereby incorporated by reference, disclose methods and precursors for CVD deposition of ruthenium and ruthenium oxide on integrated circuit substrates.

The term "thin film" and related terms herein refer to layers or films of integrated circuit material having a thickness not exceeding 1 μm, generally not exceeding 500 nm, and typically about 200 nm or less. The term "ultra-thin" generally refers to a thin film having a thickness in a range of about from 1 nm to 30 nm.

FIG. 1 depicts a section 100 of a wafer substrate 101 containing an integrated circuit memory cell. In FIG. 1, a field oxide region 104 is formed on a surface of a silicon base layer 102 of substrate wafer 101. Source/drain regions 106 and 108 are formed separately from each other within silicon layer 102. A gate-insulating dielectric layer 110 is formed on silicon substrate layer 102 between the source/drain regions 106, 108. Typically, dielectric layer 110 comprises a natural oxide, such as silicon dioxide, $SiO_2$. Further, a ruthenium gate electrode 112 is formed in accordance with the invention on gate insulating layer 110. These source/drain regions 106, 108, gate insulating layer 110 and gate electrode 112 together form a MOSFET 114.

A first interlayer dielectric layer (ILD) 116 made of BPSG (boron-doped phospho-silicate glass) is formed on wafer substrate 101 covering silicon layer 102, oxide region 104 and source/drain regions 106, 108. ILD 116 is patterned to form vias 117, 118 to source/drain regions 106, 108, respectively. Vias 117, 118 are filled to form plugs 119, 120, respectively. Plugs 119, 120 are electrically conductive and typically comprise polycrystalline silicon or tungsten. A diffusion barrier layer 121 is formed on ILD 116 and patterned to be in electrical contact with plug 120. Diffusion barrier layer 121 is made of, for example, titanium nitride, and typically has a thickness of about 10 nm to 20 nm. Diffusion barrier layers, such as titanium nitride, inhibit the diffusion of chemical species between the underlying and overlying layers of the memory 100.

As depicted in FIG. 1, a ruthenium-containing bottom electrode layer 122 having a thickness of 100 nm is deposited in accordance with the invention on nitride diffusion barrier layer 121. Then a ferroelectric thin film 124 is formed on bottom electrode layer 122. A ruthenium-containing top electrode layer 126, made in accordance with the invention and having a thickness of 100 nm, is formed on the ferroelectric thin film 124. Bottom electrode layer 122, ferroelectric thin film 124 and top electrode layer 126 together form ferroelectric capacitor 128.

Adhesive layers (not shown), such as titanium, are used conventionally to enhance the adhesion of the electrodes to adjacent underlying or overlying layers of the circuits. A feature of certain embodiments of methods in accordance with the invention is that plasma treatment of a substrate surface enables good adhesion of a ruthenium-containing thin film without an adhesive layer. Also, certain embodiments in accordance with the invention do not include a diffusion barrier 121 because ruthenium-containing bottom electrode layer 122 functions as both a conductive electrode and a diffusion barrier.

A second interlayer dielectric layer (ILD) 136 made of NSG (nondoped silicate glass) is deposited to cover ILD 116, diffusion barrier layer 121, and ferroelectric capacitor 128. A PSG (phospho-silicate glass) film or a BPSG (boron phospho-silicate glass) film could also be used in layer 136.

ILD 136 is patterned to form a via 137 to plug 119. A metallized wiring film is deposited to cover ILD 136 and fill via 137 and then patterned and etched to form plug 137, source electrode wiring 138 and top electrode wiring 139. Wirings 138, 139 preferably comprise ruthenium-containing interconnect metal with a thickness of about from 200 nm to 300 nm formed in accordance with the invention. An ILD 142 covers wirings 138, 139 and ILD 136.

Figure 2:
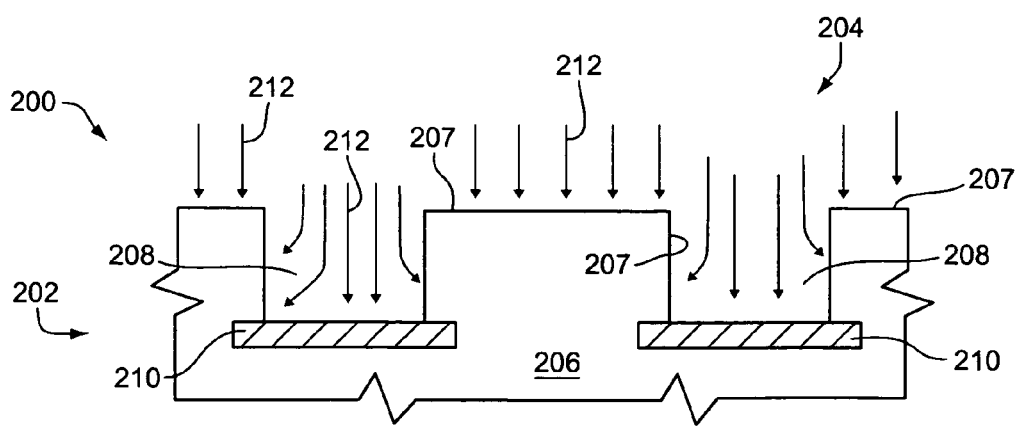
FIG. 2 depicts schematically a cross-sectional view of a portion of an integrated circuit in an intermediate phase of fabrication in which plasma treatment of a dielectric surface is being conducted in accordance with the invention with excited iodine or other excited surfactant species.

FIG. 2 depicts schematically a cross-sectional view 200 of a portion 202 of an integrated circuit 204. Portion 202 includes a dielectric layer 206 having a surface 207. Dielectric layer 206 typically comprises a silicon-containing dielectric material, such as, but not limited to, $SiO_2$, BPSG, carbon-doped silicon oxide (e.g., CORAL™), nitrogen-doped silicon oxide, SiN, carbon-doped silicon nitride, SiC, and nitrogen-doped silicon carbide. A dielectric layer 206 also may include non-silicon-containing low-k dielectric material instead of or in addition to silicon-containing dielectric material; for example, a commercially-available polymer-based carbon-hydrogen-oxygen containing dielectric material, such as SILK™. Integrated circuit portion 202 includes void spaces 208 located in dielectric layer 206. Void spaces 208 typically serve as vias or trenches to accommodate interlevel electrical connections and other electrically-conductive metal-containing circuit structures. Integrated circuit 204 also includes circuit elements 210, located at the bottom of void spaces 208. Circuit elements 210 are one or several of various elements used in integrated circuits; for example, passive conductive elements, such as conductive wiring, and active elements, such as a capacitor and a transistor. FIG. 2 depicts portion 202 in an intermediate phase of fabrication in which plasma treatment of surface 207 of dielectric layer 206 is being conducted in accordance with the invention with excited iodine or other excited surfactant species. Arrows 212 represent plasma treatment in accordance with the invention of substrate surface 207. Preferably, plasma treatment is conducted by generating plasma discharge, which creates excited iodine or other excited surfactant species, as described in more detail below.

Figure 3:
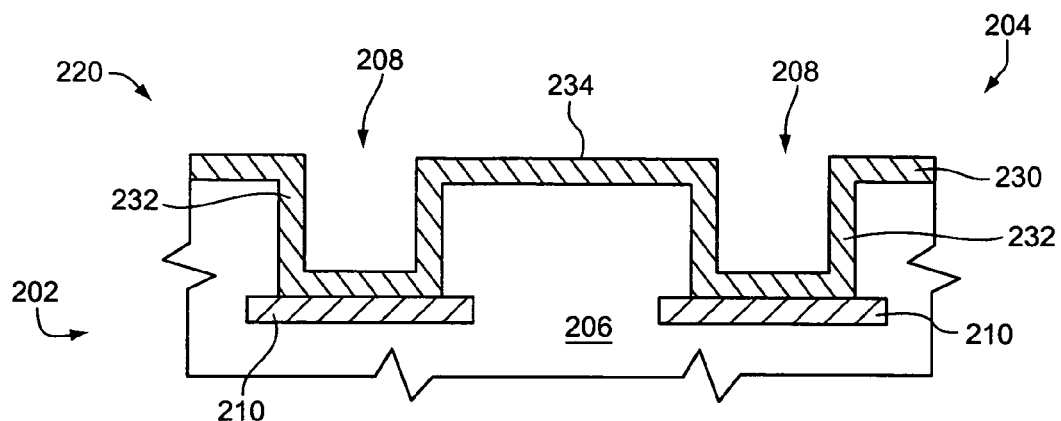
FIG. 3 depicts schematically the section of FIG. 2 in a further intermediate phase of fabrication in which a ruthenium-containing seed layer has been formed on the plasma-treated dielectric layer.

FIG. 3 depicts schematically sectional view 220 of portion 202 in a further intermediate phase of fabrication in which a ruthenium-containing diffusion-barrier/seed layer 230 has been formed on surface 207 of the plasma-treated dielectric layer 206, preferably by using a MOCVD method to deposit the ruthenium. Ruthenium-containing ultra-thin film 230 typically has a thickness in a range of about from 1 nm to 20 nm. Diffusion-barrier/seed layer 230 includes lower portions 232 covering the inside surfaces of void spaces 208, and an upper portion 234 covering the upper surfaces of dielectric layer 206.

Figure 4:
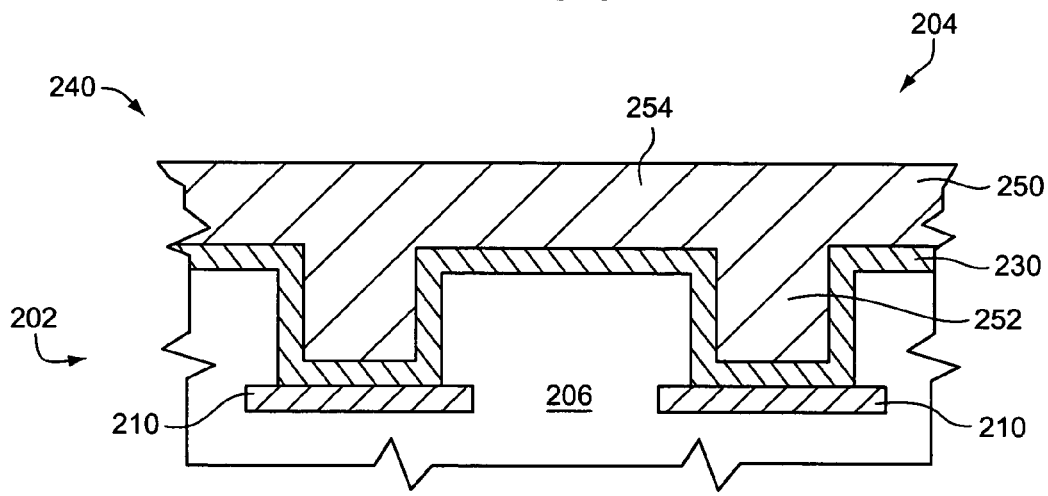
FIG. 4 depicts schematically the section of FIG. 3 in a later phase of fabrication in which a second, copper-containing metal layer has been electroplated onto the ruthenium-containing seed layer.

FIG. 4 depicts schematically sectional view 240 of portion 202 in a later phase of fabrication in which a second, copper-containing metal layer 250 has been deposited on ruthenium-containing seed layer 230. In preferred embodiments, metal layer 250, typically comprising copper or another metal instead of or in addition to copper, is deposited using an electroplating technique. As depicted in FIG. 4, metal layer 250 comprises lower portions 252 that fill void spaces 208, and an upper portion 254 located on the upper portions 234 of ruthenium seed layer 230.

Figure 5:
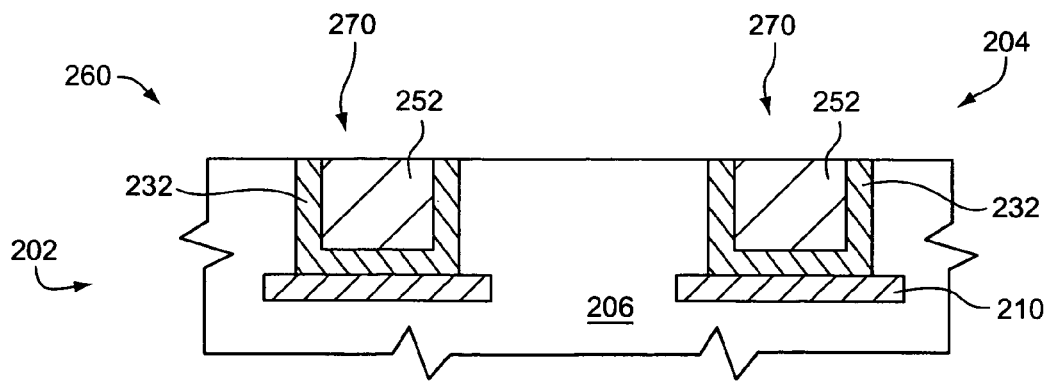
FIG. 5 depicts schematically the section of FIG. 4 in a later phase of fabrication in which the second, copper-containing metal layer has been polished back to form conductive copper wires in the integrated circuit.

FIG. 5 depicts schematically sectional view 260 of portion 202 in a still later phase of fabrication in which upper portion 254 of copper-containing metal layer 250 and the upper portion 234 of diffusion-barrier/seed layer 230 have been removed, typically by a conventional chemical metal polishing (CMP) technique. Remaining portions 232 of ruthenium-containing diffusion-barrier/seed layer 230 and lower portions 252 of copper layer 250 are thereby insulated from each other and form conductive wiring structures 270. In other embodiments not shown, void spaces 208 are lined with a diffusion barrier or adhesion layer, such as TiN, before formation of ruthenium-containing layer 230. An advantage of method in accordance with the invention, however, is that ruthenium-containing layer 230 serves both as a seed layer and a diffusion barrier, thereby eliminating processes for forming a separate diffusion barrier or adhesion layer, such as TiN.

Figure 6:
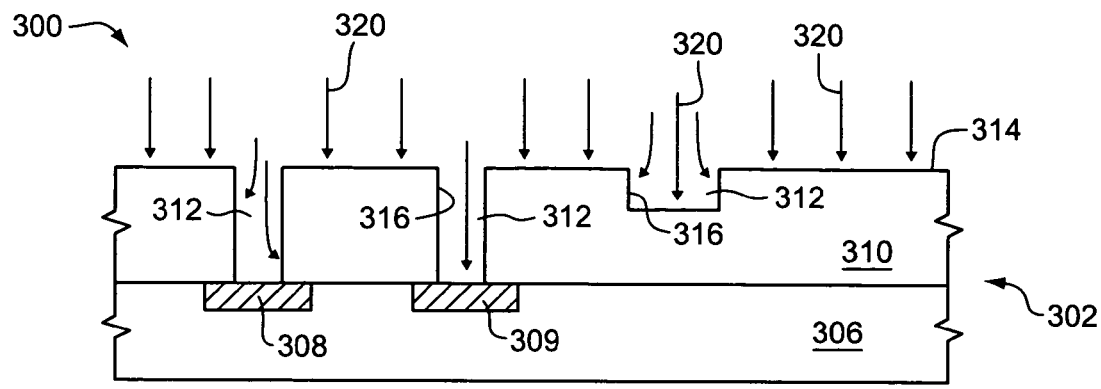
FIG. 6 depicts schematically a section of another integrated circuit wafer substrate in an intermediate phase of fabrication in which plasma treatment in accordance with the invention is being conducted with excited iodine or other excited surfactant species.

FIG. 6 depicts schematically a section 300 of an integrated circuit wafer substrate 302 in an intermediate phase of fabrication. Section 300 includes a device layer 306, typically containing dielectric or semiconductor material. Active components 308, 309 represent active devices or electrical connectors. A dielectric layer 310 located on device layer 306 contains etched regions (features) 312. Dielectric layer 310 typically comprises a silicon-containing dielectric material, such as, but not limited to, $SiO_2$, BPSG, carbon-doped silicon oxide (e.g., CORAL™), nitrogen-doped silicon oxide, SiN, carbon-doped silicon nitride, SiC, and nitrogen-doped silicon carbide. Dielectric layer 310 also may include non-silicon-containing low-k dielectric material instead of or in addition to silicon-containing dielectric material; for example, a commercially-available polymer-based carbon-hydrogen-oxygen containing dielectric material, such as SILK™. The top surface of dielectric layer 310 comprises at least a portion of the substrate surface of wafer 302 in an intermediate phase of fabrication, including unetched substrate surface portion 314 and etched substrate surface portions 316. Arrows 320 represent plasma treatment in accordance with the invention of substrate surface portions 314, 316. Preferably, plasma treatment is conducted by generating plasma discharge, which creates excited iodine or other excited surfactant species, as described in more detail below.

Figure 7:
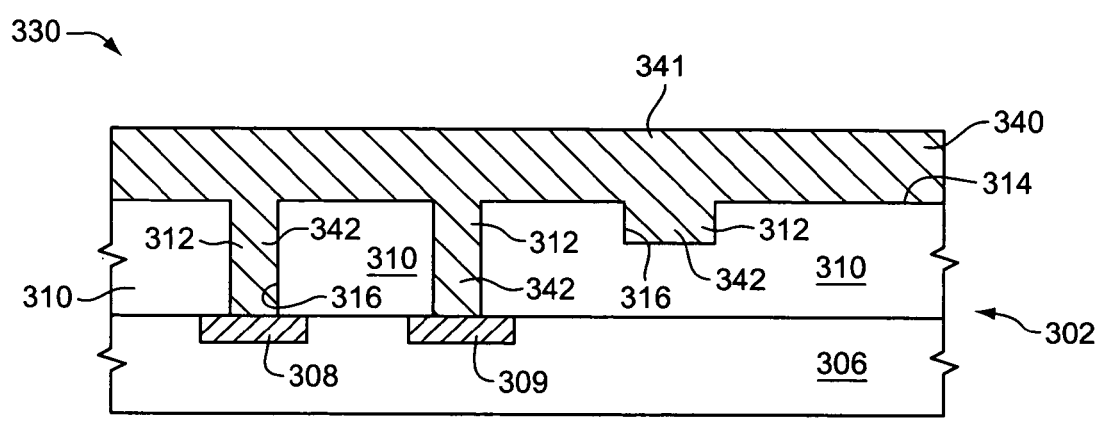
FIG. 7 depicts schematically the section of FIG. 6 in a further intermediate phase of fabrication in which a ruthenium-containing layer has been formed on the plasma-treated dielectric layer.

FIG. 7 depicts schematically a section 330 of integrated circuit wafer 302 in a further intermediate phase of fabrication. Ruthenium-containing layer 340 has been formed on plasma-treated dielectric layer 310, including on plasma-treated surface portions 314, 316. Ruthenium-containing layer 340 includes upper metal layer 341 covering surface portion 314 and located above the plane of surface 314, and lower metal layer 342 filling etched portions 312.

Figure 8:
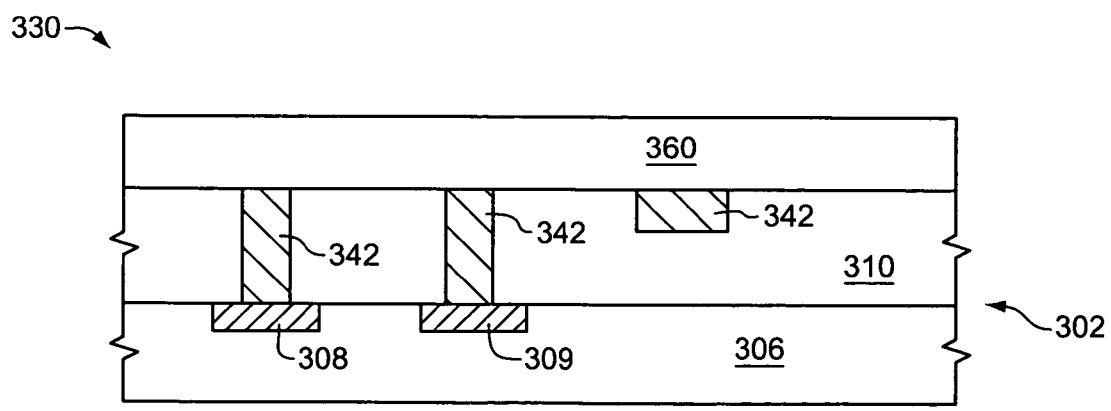
FIG. 8 depicts schematically the section of FIG. 7 in a later phase of fabrication in which the ruthenium-containing layer has been removed from the upper surface, thereby forming ruthenium wiring lines that are covered by a top ILD.

FIG. 8 depicts section 350 of substrate 302 in a later phase of fabrication. Upper ruthenium-containing layer 341 has been removed from surface 312, thereby forming ruthenium wiring lines 342. FIG. 8 shows ILD 360 covering ruthenium-containing wires 342.

The word "substrate" herein can mean an entire workpiece, an underlying insulative material on which wiring is formed, as well as any object on which some material is deposited. In this disclosure, the terms "substrate", "substrate surface" and related terms generally mean the surface of the workpiece as it exists at a particular phase of fabrication and on which a particular fabrication process is being conducted.

The long dimensions of workpieces 101, 202 and 302 and of insulative layers 102, 206 and 306 in FIGS. 1–5 define planes that are considered to be a "horizontal" plane herein, and directions perpendicular to these planes are considered to be "vertical". Terms of orientation herein, such as "above", "top", "upper", "below", "bottom" and "lower", mean relative to layers 102, 204, 306. That is, if a second element is "above" a first element, it means it is farther from layer 102, 206 or 306; and if it is "below" another element, then it is closer to the layer 102, 204, or 306 than the other element. Similarly, dimensional terms, such as "high" and "higher", have very usual meanings with reference to the horizontal plane defined by the long dimensions of layers 102, 206, 306 in FIGS. 1–5. Terms such as "above" and "below" do not, by themselves, signify direct contact. However, terms such as "directly on" or "directly onto" do signify direct contact of at least a portion of one layer with at least a portion of an underlying or adjacent layer. As depicted in FIGS. 2–5, metal wires 270, 342 are formed in accordance with the invention directly on plasma-treated substrate surfaces 207, 314, 316. It is understood that embodiments in accordance with the invention are suitable for fabricating a plurality of wires or other metal-containing films in single-level or multilevel electronic devices.

Figure 9:
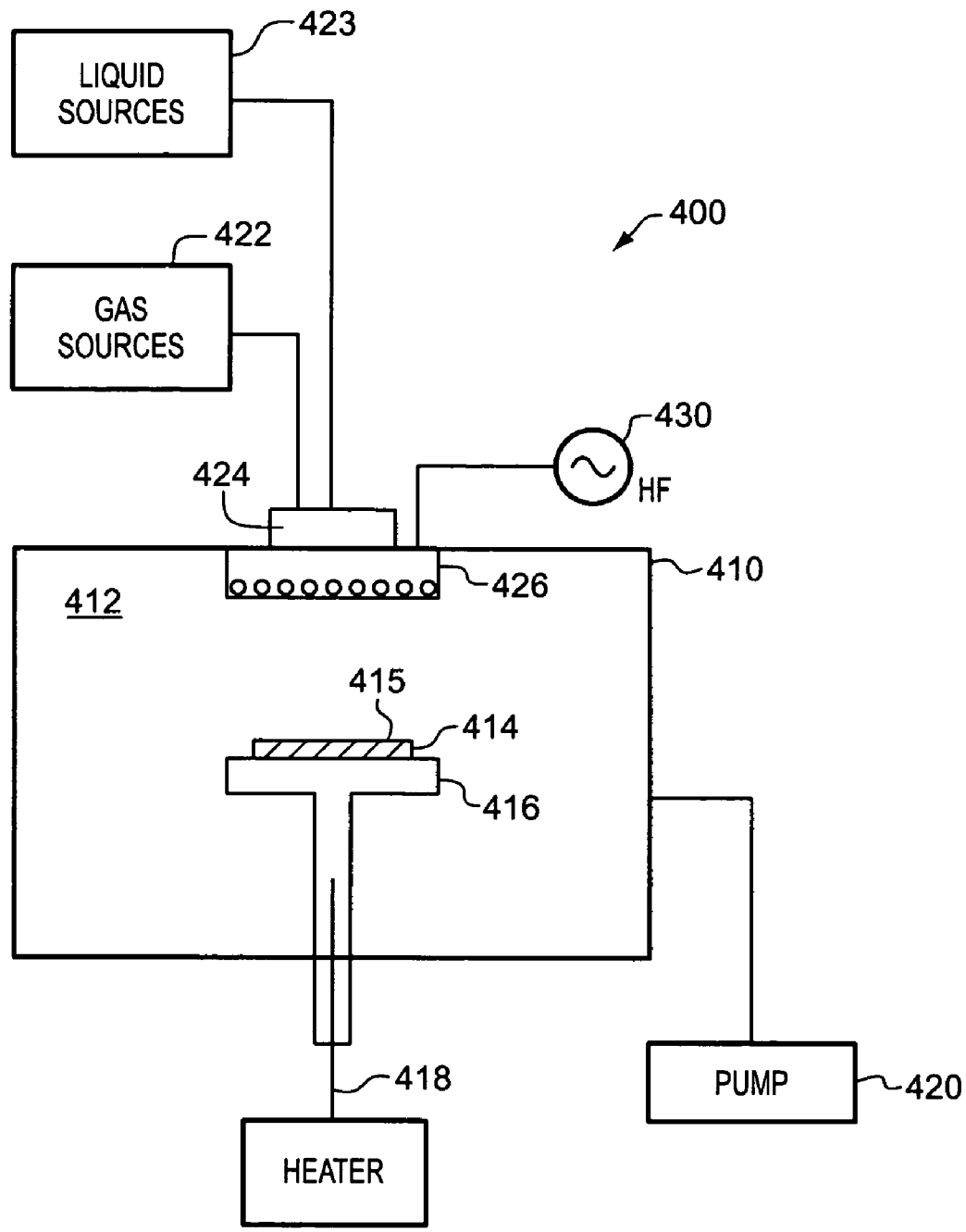
FIG. 9 depicts schematically a plasma treating apparatus suitable for plasma-treating a substrate surface in accordance with the invention.

FIG. 9 depicts in schematic form a plasma treating apparatus 400 suitable for plasma-treating a substrate surface in accordance with the invention. Apparatus 400 includes a vacuum chamber 410 having a chamber interior 412 capable of holding one or more substrates 414 having an upper substrate surface 415 which is to be treated. Substrate 414 is supported in chamber 410 on substrate holder 416. Substrate holder 416 is functionally coupled with a heating unit 418 for heating substrate 414 to a desired temperature. Generally, substrate 414 is maintained at a temperature in a range of about from 20° C. to 500° C., typically in a range of about 200° C. to 400° C. As is typical in such vacuum chambers, chamber interior 412 is evacuated or pressurized as desired by a suitable pump apparatus schematically represented in FIG. 9 as pump 420. In a method in accordance with the invention, pressures in the vacuum chamber generally are maintained in a range of about from 10 mTorr to 1 Torr, preferably at about 100 mTorr to 600 mTorr.

One or more volatile precursors of one or more surfactant species in accordance with the invention are supplied to vacuum chamber 410 from gas sources 422 and liquid sources 423, as appropriate. Inert diluent and carrier gases, if used, are also supplied from gas sources 422, as appropriate. Gases and liquids from gas sources 422 and liquid sources 423, respectively, are introduced into mixing bowl 424. The interior of mixing bowl 424 is connected to interior 412 of vacuum chamber 410 through showerhead 426.

A liquid, when used, is gasified into carrier gas upstream of mixing bowl 424, or liquid is injected as a fine mist by techniques known in the art into mixing bowl 424. The interior of mixing bowl 424 is maintained at a temperature typically in a range of about from room temperature to 200° C. Fine liquid mist particles evaporate quickly in mixing bowl 424. The gas resulting from gasification of liquid mixes with the other gases in mixing bowl 424. The resulting gaseous mixture containing one or more gaseous precursors of surfactant species flows from mixing bowl 424 through showerhead 426 into interior 412 of vacuum chamber 410. The flow rates of gases and liquids from sources 422, 423 are typically controlled by volumetric or mass flow rate controllers using techniques known in the art. Generally, the gaseous mixture flowing into vacuum chamber 410 contains inert diluent gas that functions in maintaining desired pressure in vacuum chamber 410 and in maintaining relatively dilute concentrations of surfactant precursor in the gaseous mixture.

Plasma discharge is generated and sustained by energy applied to vacuum chamber 410 through a high-frequency (HF) generator 430, which supplies HF radio-frequency (RF) power. Usually, HF RF power is applied to vacuum chamber 410 at showerhead 426. Typically, the HF RF plasma energy used is 13.56 MHz, although the invention is not limited to any exact frequency value. Generally, the HF RF has a frequency in a range of about from 1 MHz to 100 MHz, preferably 2 MHz to 30 MHz. HF RF power is generally applied at showerhead 426 at a level of about 0.1 Watts per $cm^2$ to 5 Watts per $cm^2$ of substrate surface. The excited species present in the plasma proximate to the substrate surface activate the substrate surface in accordance with the invention to make a plasma-treated substrate surface. In a preferred embodiment of a method in accordance with the invention, a dual-frequency chamber also provides low-frequency radio-frequency (LF RF) power to the plasma. With respect to applying HF power, the term "to the vacuum chamber" is used here in a broad sense. For example, HF power generator supplies power to the reactant gas mixture flowing from mixing bowl 424 through showerhead 426 into vacuum chamber interior 412, as depicted in FIG. 9, or alternatively (not shown) it supplies power in vacuum chamber interior 412.

With respect to introducing or flowing gases and gaseous molecules "to the vacuum chamber", the term "to the vacuum chamber" and related terms are used broadly to mean towards and up to the vacuum chamber or into the vacuum chamber depending on where plasma-forming power is applied in a particular plasma treating apparatus used in accordance with the invention. For example, in certain embodiments in accordance with the invention, plasma-initiating power is applied to a gaseous stream prior to its entry into the vacuum chamber, so that molecules originally present in the gaseous stream are already broken up into excited species upon actual entry into the vacuum chamber.

In certain embodiments in accordance with the invention, nonreactive diluent gas is used to dilute surfactant precursor reactant, to stabilize the pressurize in the vacuum chamber and to strike a stable plasma. Suitable nonreactive or inert gases include noble gases, such as neon, helium, and argon. Selection of operating variables, such as composition and flow rates of surfactant precursor and inert gas, power level, chamber pressure, and substrate temperature, influence the properties of a plasma-treated substrate surface. Dynamically varying one or more variables during the course of plasma-treating a substrate surface provides further control of the properties of the surface.

Figure 10:
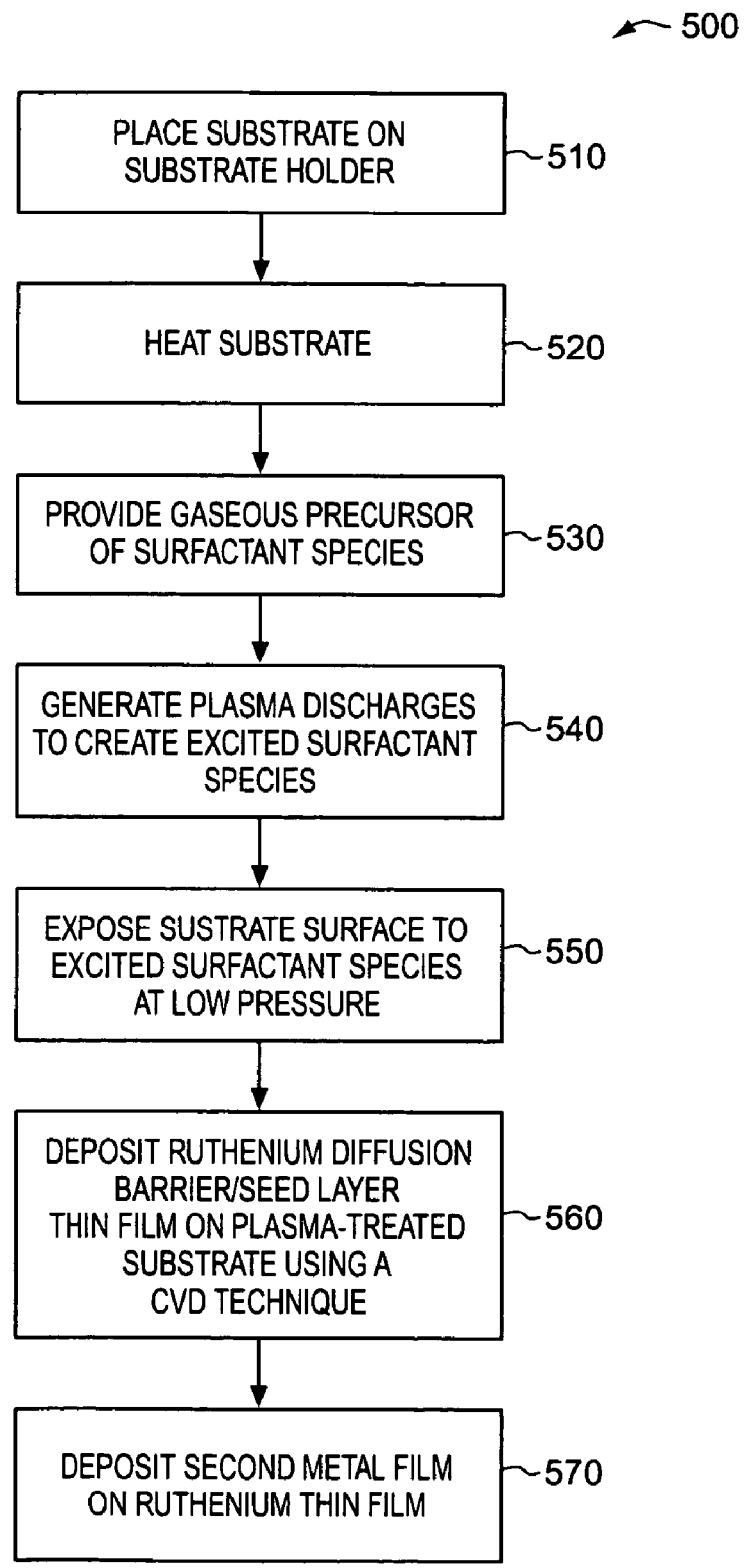
FIG. 10 contains a process flow diagram of a generalized method in accordance with the invention.

FIG. 10 contains a process flow diagram 500 of a method in accordance with the invention for depositing a ruthenium thin film on a plasma treated surface during formation of an electrically-conductive copper-containing circuit element. Although process flow 500 is described with reference to FIG. 9, it is clear that embodiments in accordance with the invention are useful for plasma treating many different types of substrate surfaces having various compositions and topographies and using various configurations of apparati. It is understood that plasma treating processes of a method in accordance with the invention preferably are generally continuous, and that processes 520, 530, 540 and 550 of FIG. 10 are conducted more or less concurrently (although heating of a substrate and initiation of gas flow generally precedes application of power to generate a plasma discharge).

In processes 510, a substrate wafer 414 is placed on a substrate holder 416 in a vacuum chamber 412. Substrate surface 415 comprises base silicon or one or more other integrated circuit layers, typically comprising a dielectric material or a metallic nitride. For example, dielectric materials suitable for plasma treatment in accordance with the invention include silicon-containing dielectric material, such as, but not limited to, $SiO_2$, BPSG, carbon-doped silicon oxide (e.g., CORAL™), nitrogen-doped silicon oxide, SiN, carbon-doped silicon nitride, SiC, and nitrogen-doped silicon carbide. Suitable dielectric materials also include non-silicon-containing low-k dielectric material instead of or in addition to silicon-containing dielectric material; for example, a commercially-available polymer-based carbon-hydrogen-oxygen containing dielectric material, such as SILK™. Examples of metallic nitrides include TiN, TaN, WN, TiAlN, TiSiN, and TaSiN, which nitrides are typically formed on substrate 414 using any one of a number of conventional techniques including PVD, CVD and sputtering techniques. Pressure in vacuum chamber 412 is maintained in a range of about from 10 mTorr to 1 Torr, typically in a range of about from 100 mTorr to 600 mTorr.

In processes 520, substrate 414 is heated to a temperature in a range from about 20° C. to 500° C. Preferably, a heater 418 in substrate holder 416 heats the wafer and maintains its desired temperature.

In processes 530, a gaseous volatile precursor of a surfactant species is flowed into vacuum chamber 412 through showerhead inlet 426. Generally, an inert gas, such as argon, helium or nitrogen, is also flowed into vacuum chamber 412. An inert gas helps to stabilize the pressure in vacuum chamber 412 and helps to strike a stable plasma. Depending on the composition of one or more surfactant precursors, an inert gas mixes with volatile surfactant precursor in mixing bowl 424, or an inert gas also serves as a carrier gas that carries volatile precursor from gas source 422 or liquid source 423, in accordance with conventional techniques. In certain embodiments, liquid precursor is injected through a liquid injector so that small droplets evaporate immediately at the elevated temperature and reduced pressure in mixing bowl 426. Optionally, helium gas or another inert gas is also flowed into the mixing bowl at a precursor/inert flow rate ratio in a range of about 1/10 to 1/2. Preferred volatile precursor gases for generating excited iodine species include $C_2H_5I$ and $CH_3I$. These are preferred because they are relatively chemically stable and have a relatively high volatility, facilitating delivery of the precursor to a plasma-forming chamber. Other suitable volatile iodine precursor gases include $I_2$, $CH_2I_2$, $C_2H_4I_2$, and $C_3H_7I$. Volatile precursors for generating excited lead species include: Bis(2, 2,6,6-tetramethyl-3,5-heptanedionato)lead $(Pb(tmhd)_2)$; lead (II) hexafluoroacetylacetonate $(Pb(hfac)_2)$; and $Pb(C_6H_5)_4$, (tetraphenyllead). Volatile precursors for generating excited tin species include: hexamethylditin; tetra-n-butyltin; tetramethyltin; tin(II)acetylacetonate $(Sn(acac)_2)$; tin t-butoxide $(Sn(OC_4H_9)_4)$. Volatile precursors for generating excited gallium species include: gallium (III) acetylacetonate $(Ga(acac)_3)$; and triethylgallium $(Ga(C_2H_5)_3)$. Volatile precursors for generating excited indium species include: yclopentadienylindium $(C_5H_5In)$; and trimethylindium. In a vacuum chamber having an internal free space of about 20 l volume through which about 250 sccm (standard cubic centimeter per minute) inert gas is flowing, the total flow rate of surfactant precursor is generally in a range of about from 5 sccm to 100 sccm, preferably in a range of about from 10 sccm to 30 sccm.

Generally, suitable excited surfactant species include the property of being immiscible with the metal being deposited by CVD over adsorbed surfactant species on a treated surface. While the invention is not dependent on a particular theory, it may be that a relatively oxidizable, low-melting-point metal atom scavenges impurities from the substrate surface on which Ru (or other metal) is being deposited. Suitable surfactant species generally also include the property of being low-melting-point metals that possess volatile organic precursors of relatively low molecular weight.

In processes 540, power is applied to ignite and sustain plasma discharges. Plasma discharges create excited surfactant species from one or more volatile precursors. Plasma generation is generally conducted using HF-RF only, which is applied in the vicinity of showerhead 426 or remotely. LF-RF power is generally not used in addition to HF-RF power because LF-RF power would typically be applied at or near the substrate surface, which could produce detrimental effects at the substrate surface. Plasma generation and discharge is generally conducted at pressure in a range of about from 10 mTorr to 1 Torr, typically in a range of about from 100 mTorr to 600 mTorr, using HF power HF-RF power at 13.56 MHz in a range of about from 0.1 $W/cm^2$ to 2.0 $W/cm^2$ of substrate surface. In other embodiments in accordance with the invention, plasma is generated by applying microwave energy at a power level in a range of about from 0.1 $W/cm^2$ to 2.0 $W/cm^2$ a substrate surface.

In processes 550, a substrate surface 415 is exposed to the excited surfactant species at low-pressure (generally in a range of about from 10 mTorr to 1 Torr, typically in a range of about from 100 mTorr to 600 mTorr) to form a plasma-treated substrate surface. It is believed that the excited surfactant species chemisorb on the substrate surface to create a monolayer or sub-monolayer coating of surfactant atoms on substrate surface 415; for example, iodine atoms, lead atoms, tin atoms, gallium atoms or indium atoms, depending on the precursor present in the plasma. The exposure time of substrate surface 415 to excited species in vacuum chamber 412 is generally in a range of about from 5 seconds to 60 seconds, preferably about 10 seconds to 30 seconds.

As described herein with reference to FIGS. 6 and 7, plasma generation and discharge to create excited surfactant species and exposure of the substrate surface to the excited surfactant species is conducted in vacuum chamber 412 holding substrate 414. In other embodiments, plasma generation, plasma discharge and creation of excited species are conducted remotely from the vacuum chamber, and the excited species are flowed into the vacuum chamber proximate to the substrate surface being treated.

In processes 560, a metal thin film is deposited on plasma-treated substrate surface 415 using a CVD technique. Numerous conventional techniques and methods are suitable for depositing a metal thin film on a plasma-treated surface, including MOCVD, PECVD, and ALD. Correspondingly, a wide variety of commercially available CVD modules are suitable for depositing a metal thin film in accordance with the invention. A method in accordance with the invention is particularly well-suited for deposition of a Ru-containing thin film. Methods for depositing ruthenium, ruthenium oxide, ruthenium silicide and other ruthenium-containing compounds have become known in the art. For example, U.S. Pat. No. 6,074,945, issued Jun. 13, 2000, to Vaartstra et al., U.S. Pat. No. 5,372,849, issued Dec. 13, 1994, to McCormick et al., and U.S. Patent Application Publication No. U.S. 2003/0037802 A1, published Feb. 27, 2003, naming Nakahara et al., which are incorporated by reference, disclose methods and precursors for CVD deposition of ruthenium and ruthenium oxide on integrated circuit substrates. Methods in accordance with the invention are particularly useful for depositing a Ru-containing ultra-thin film, such as ruthenium thin film 230 in FIG. 3. A Ru-containing thin film, such as thin film 230, is especially useful because it can serve as both as a seed layer for subsequent deposition of copper by electroplating or other deposition technique, and as a diffusion barrier to prevent diffusion of chemical species into or out of copper-containing elements. Methods in accordance with the invention are also useful for depositing thin films comprising other metals, such as copper, aluminum, tantalum, titanium, tungsten and others onto a plasma-treated substrate surface. After deposition of the ruthenium (or other metal) thin film is completed in processes 560, further processing of an integrated circuit wafer is continued. In processes 570 of method 500, a second, copper-containing layer is electroplated onto the substrate surface, such as copper layer 250 depicted in FIG. 4.

In preferred embodiments in accordance with the invention, processes 560 for depositing a metal thin film on a plasma-treated substrate surface are conducted in a reaction chamber separate from vacuum chamber 412, in which plasma-treating of the substrate surface occurs. Transferring the plasma-treated substrate 414 from one tool comprising vacuum chamber 412 into another tool avoids cross-contamination of CVD processes 560 with byproducts and residuals from plasma treatment in processes 550. Transfer of the plasma-treated substrate is typically conducted using a vacuum-pump transfer chamber that avoids atmospheric exposure of the plasma-treated substrate. In other embodiments, plasma-treating processes 550 and metal deposition processes 560 are conducted in the same vacuum chamber by using efficient gas-flow and purging processes in efficiently timed fabrication stages.

EXAMPLE 1

A series of 200 mm silicon semiconductor wafers having a thermal silicon dioxide, $SiO_2$, substrate surface were plasma-treated in accordance with the invention. Each untreated wafer was placed on a heated substrate holder in vacuum chamber having an internal free volume of approximately 20 liters. The pressure of the chamber was maintained at about 300 mTorr. The wafer was heated to a temperature in a range of about from 300° C. to 360° C. Argon gas was flowed continuously via an inlet showerhead through the vacuum chamber at flow rate of about 250 sccm. A dose of ethyliodine ($C_2H_5I$) surfactant precursor gas having a volume of 25 cc at 157 Torr pressure was flowed during a treatment time of approximately 20 seconds at an approximately uniform flowrate (i.e., about 15 sccm ethyliodine) into the inlet showerhead, where it mixed with the argon gas and the mixture flowed into the vacuum chamber. During the 20-second treatment time, 300 W HF-RF power was applied at 13.56 MHz to the showerhead to generate a plasma in the argon-ethyliodine gas mixture flowing into the reaction chamber. A distance of approximately 2.5 cm separated the outlet holes of the showerhead from the substrate surface. As a result, plasma and plasma discharge proximate to the substrate surface generated excited iodine species for treating the substrate surface.

After plasma treatment, a MOCVD technique was used to deposit a thin film of ruthenium metal, Ru, on each of several treated wafers. A substrate wafer temperature was maintained at about 360° C. The reaction chamber wall temperature was about 130° C. to 150° C. Solid $RuCp_2$ was vaporized in a conventional gasification chamber at 110° C. into argon carrier gas. Argon carrier gas flowed at a flow rate of approximately 100 sccm through the gasification chamber. The temperature of the delivery line carrying the vaporized ruthenium precursor and carrier gas into the CVD reaction chamber was 160° C. Argon gas was also flowed on the back side of the substrate wafer at flow rate of 30 sccm. The flow rate of oxygen gas, $O_2$, into the chamber was 80 sccm. The flow rate of diluent nitrogen gas, $N_2$, into the chamber was 100 sccm. Pressure of the reaction chamber was maintained at about 300 mTorr. Each wafer was exposed to identical MOCVD conditions, but the deposition time was varied between 50 and 300 seconds. In addition, a series of identical semiconductor wafers having a silicon dioxide substrate surface without plasma treatment were also exposed to the same MOCVD conditions for various deposition times between 50 and 300 seconds.

Figure 11:
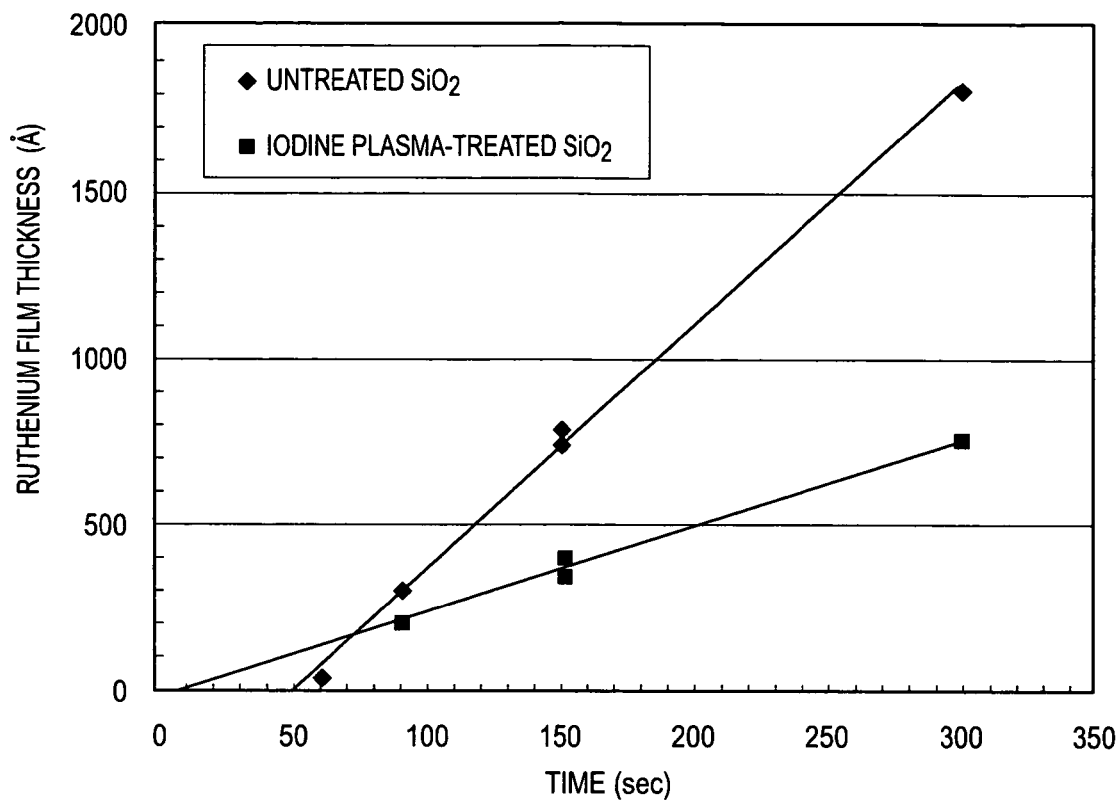
FIG. 11 depicts a graph in which the film thicknesses of ruthenium, Ru, on silicon oxide, $SiO_2$, with and without prior iodine-plasma treatment are plotted as a function of time.

FIG. 11 depicts a graph in which the film thickness of ruthenium, Ru, on silicon oxide, $SiO_2$, with and without prior iodine-plasma treatment is plotted as a function of time. The data in FIG. 11 indicate that iodine-plasma pretreatment of the $SiO_2$ substrate surface reduced the nucleation delay of ruthenium-CVD from about 50 seconds to less than about five seconds. Furthermore, the iodine-plasma treatment decreased the growth rate of the ruthenium film on the $SiO_2$ substrate from about 7 Ångstom/sec (Å/sec) to about 2.5 Å/sec. This inhibition of ruthenium deposition onto ruthenium is advantageous for thickness control during fabrication of thin films, especially ultra-thin films having a thickness of about 20 nm or less. Also, measurements indicated that the iodine plasma treatment reduced surface roughness of the CVD-deposited Ru from 89 Å root mean square (rms) on untreated $SiO_2$ to 37 Å on the plasma-treated surface.

In this example, plasma treatment in accordance with the invention and subsequent MOCVD deposition of ruthenium metal were conducted using the same apparatus and vacuum/reaction chamber.

EXAMPLE 2

A series of 200 mm silicon semiconductor wafers having a thermal silicon dioxide, $SiO_2$, substrate surface were plasma-treated in accordance with the invention as in Example 1.

After plasma treatment, a conventional ALD technique was conducted to deposit a thin film of ruthenium metal, Ru, on each of several treated wafers. The ALD technique was conducted on different wafers at one of two different temperatures in the reaction chamber, 330° C. and 360° C. The ALD technique was varied between wafers by varying the total number of ALD deposition cycles conducted with a given wafer. The total number of ALD deposition cycles was repeated up to three hundred times to deposit a thin film of ruthenium. The MOCVD apparatus used in Example 1 was modified for the ALD processes.

The conventional ALD deposition cycle used included four stages: a ruthenium-containing precursor dosage; a first, post-precursor inert-gas purge stage; a surface-reactivation stage, in which an oxidizing agent treated the substrate surface to make it again reactive with the ruthenium-containing precursor; and a second, post-reactivation inert-gas purge stage. The first stage of the ALD cycle, a ruthenium-containing precursor dosage, was conducted by vaporizing solid $RuCp_2$ in a conventional gasification chamber at 110° C. into argon carrier gas. Argon carrier gas flowed at a flow rate of approximately 100 sccm through the gasification chamber. The temperature of the delivery line carrying the vaporized ruthenium precursor and carrier gas into the 20-liter ALD reaction chamber was 160° C. Argon gas was also flowed on the back side of the substrate wafer at flow rate of 30 sccm. The flow rate of diluent nitrogen gas, N2, into the chamber was 200 sccm. Pressure of the reaction chamber was maintained at about 500 mTorr and the ruthenium-containing precursor dosage was continued for 10 sec.

The second stage of the ALD cycle involved a post-precursor inert-gas purge stage. During this stage, inert diluent gas was flowed at 200 sccm through the reaction chamber at a pressure of 500 mTorr and was continued for 20 sec.

In the surface-reactivation stage, the oxidizing agent, oxygen, was flowed at a flow rate of 200 sccm into the reaction chamber at a pressure of 500 mTorr. Inert diluent gas was also flowed at a flow rate of 100 sccm, and the pressure was maintained at 500 mTorr. This stage was continued for 10 sec. The fourth and final stage of the ALD cycle involved a post-reactivation inert-gas purge stage. During this step inert diluent gas was flowed at 200 sccm through the chamber at a pressure of 500 mTorr and was continued for 20 sec.

Figure 12:
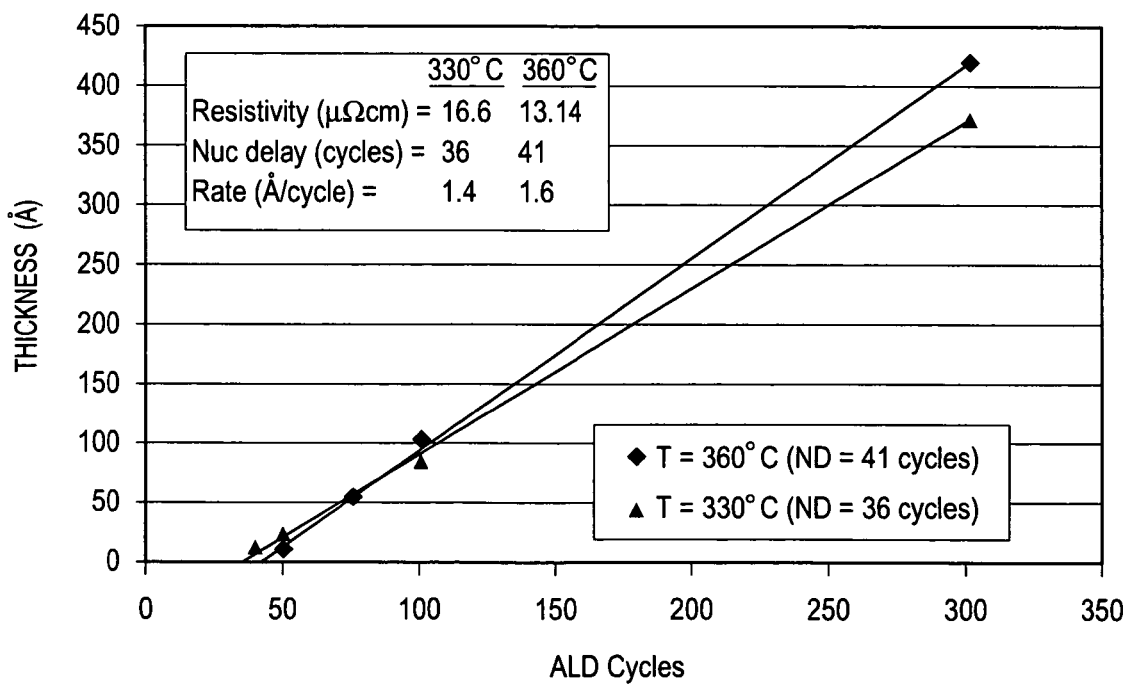
FIG. 12 depicts a graph in which the film thicknesses of ruthenium, Ru, on iodine-plasma-treated silicon oxide, $SiO_2$, are plotted as a function of the total number of ALD deposition cycles.

After the total number of ALD deposition cycles were conducted for a given wafer, the total thickness of the ruthenium thin film was measured in Ångstrom units (Å). Also, the resistivity (μΩcm) of the deposited ruthenium metal thin film was measured. FIG. 12 depicts a graph in which the film thickness of ruthenium, Ru, on iodineplasma-treated silicon oxide, $SiO_2$, is plotted as a function of the total number of ALD deposition cycles for the various wafers. Exemplary data and calculations presented in FIG. 12 show that when the ALD was conducted at 330° C., the nucleation delay (ND) after iodine-plasma pretreatment of the $SiO_2$ substrate surface was about 36 cycles, the deposition rate was about 1.4 Å/cycle, and the resistivity was about 16.6 μΩcm. When the ALD was conducted at 360° C., the nucleation delay was about 41 cycles, the deposition rate was about 1.6 Å/cycle, and the resistivity was about 13.14 μΩcm.

It is believed that plasma treatment with excited surfactant species, such as excited iodine species, enhances adsorption of surfactant species in accordance with the invention onto a substrate surface, including onto dielectric or nonmetal areas of a substrate surface as well as onto metal areas of a substrate surface. Exemplary results indicate that plasma treatment in accordance with the invention tends to decrease the nucleation delay, that is, accelerate the initiation of metal deposition onto a plasma-treated substrate surface compared to an untreated surface. On the other hand, exemplary results indicate that treatment with excited species in accordance with the invention decreases the deposition rate of metal, such as ruthenium, onto the surface after nucleation has occurred compared to an untreated surface.

The particular systems, designs, methods and compositions described herein are intended to illustrate the functionality and versatility of the invention, but should not be construed to be limited to those particular embodiments. Methods in accordance with the invention are useful in a wide variety of circumstances and applications to conduct CVD deposition of metal onto a substrate surface. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the systems, methods and compositions described in the claims below and by their equivalents.

The invention claimed is:

1. A method of depositing a ruthenium thin film by chemical vapor deposition, comprising processes of:
providing a substrate having an untreated dielectric layer;
providing an iodine-containing precursor gas;
generating a plasma discharge to create excited iodine species from said iodine-containing precursor gas;
exposing said dielectric layer to said excited iodine species to form a plasma-treated dielectric layer; and
then depositing a ruthenium thin film on said plasma-treated dielectric layer using a CVD technique.

2. A method as in claim 1 wherein:
said untreated dielectric layer does not comprise metal atoms.

3. A method as in claim 1 wherein:
said untreated dielectric layer comprises a silicon-containing dielectric compound.

4. A method as in claim 3 wherein:
said untreated dielectric layer comprises a material selected from the group consisting of $SiO_2$, BPSG, carbon-doped silicon oxide, CORAL™, nitrogen-doped silicon oxide, SiN, carbon-doped silicon nitride, SiC, and nitrogen-doped silicon carbide.

5. A method as in claim 1 wherein:
said untreated dielectric layer comprises a polymer-based carbon-hydrogen-oxygen-containing dielectric material having no silicon atoms.

6. A method as in claim 1 wherein:
said iodine-containing precursor gas comprises molecules selected from the group consisting of $C_2H_5I$, $CH_3I$ $CH_2I_2$, $C_2H_4I_2$, and $C_3H_7I$.

7. A method as in claim 1 wherein:
said iodine-containing precursor gas comprises $I_2$.

8. A method as in claim 1 wherein said depositing a ruthenium thin film on said plasma-treated dielectric layer comprises:
using a MOCVD technique.

9. A method as in claim 1 wherein said depositing a ruthenium thin film on said plasma-treated dielectric layer comprises:
using an ALD technique.

10. A method as in claim 1 wherein said depositing a ruthenium thin film comprises depositing a thin film containing substantially ruthenium atoms.

11. A method as in claim 1 wherein said depositing a ruthenium thin film comprises depositing a thin film containing substantially ruthenium oxide.

12. A method as in claim 1 wherein said exposing said dielectric layer to said excited iodine species is conducted at low pressure.

13. A method as in claim 1 wherein said depositing a ruthenium thin film on said plasma-treated dielectric layer comprises:
depositing an ultra-thin ruthenium film having a thickness in a range of about from 1 nm to 20 nm.

14. A method of depositing a ruthenium thin film by chemical vapor deposition, comprising processes of:
providing a substrate having an untreated substrate surface;
providing a precursor of a surfactant species, said surfactant species selected from the group consisting of iodine, lead, tin, gallium, and indium;
generating a plasma discharge to create an excited surfactant species from said precursor;
exposing said untreated substrate surface to said excited surfactant species to form a plasma-treated substrate surface; and
then depositing a ruthenium thin film on said plasma-treated substrate surface using a CVD technique.

15. A method as in claim 14 wherein:
said untreated substrate surface comprises an untreated dielectric layer.

16. A method as in claim 15 wherein:
said untreated dielectric layer does not comprise metal atoms.

17. A method as in claim 15 wherein:
said untreated dielectric layer comprises a silicon-containing dielectric compound.

18. A method as in claim 17 wherein:
said untreated dielectric layer comprises a material selected from the group consisting of $SiO_2$, BPSG, carbon-doped silicon oxide, CORAL™, nitrogen-doped silicon oxide, SiN, carbon-doped silicon nitride, SiC, and nitrogen-doped silicon carbide.

19. A method as in claim 15 wherein:
said untreated dielectric layer comprises a polymer-based carbon-hydrogen-oxygen-containing dielectric material having no silicon atoms.

20. A method as in claim 14 wherein:
said untreated substrate surface comprises a metal nitride.

21. A method as in claim 14 wherein:
said surfactant species comprises iodine; and
said precursor comprises an iodine atom.

22. A method as in claim 21 wherein:
said precursor comprises molecules selected from the group consisting of $I_2$, $C_2H_5I$, $CH_3I$ $CH_2I_2$, $C_2H_4I_2$, and $C_3H_7I$.

23. A method as in claim 14 wherein:
said surfactant species comprises lead; and
said precursor comprises a lead atom.

24. A method as in claim 23 wherein:
said precursor comprises molecules selected from the group consisting of Bis(2,2,6,6-tetramethyl-3,5-heptanedionato)lead (Pb(tmhd)$_2$, lead (II) hexafluoroacetylacetonate (Pb(hfac)$_2$), and Pb(C$_6$H$_5$)$_4$ (tetraphenyllead).

25. A method as in claim 14 wherein:
said surfactant species comprises tin; and
said precursor comprises a tin atom.

26. A method as in claim 25 wherein:
said precursor comprises molecules selected from the group consisting of hexamethylditin, tetra-n-butyltin, tetramethyltin, tin (II)acetylacetonate (Sn(acac)$_2$), tin t-butoxide (Sn(OC$_4$H$_9$)$_4$).

27. A method as in claim 14 wherein:
said surfactant species comprises gallium; and
said precursor comprises a gallium atom.

28. A method as in claim 27 wherein:
said precursor comprises molecules selected from the group consisting of gallium (III) acetylacetonate (Ga (acac)$_3$) and triethylgallium (Ga(C$_2$H$_5$)$_3$).

29. Method as in claim 14 wherein:
said surfactant species comprises indium; and
said precursor comprises an indium atom.

30. Method as in claim 29 wherein:
said precursor comprises molecules selected from the group consisting of cyclopentadienylindium (C$_5$H$_5$In) and trimethylindium.

31. A method as in claim 14 wherein said depositing a ruthenium thin film on said plasma-treated substrate surface comprises:
using a MOCVD technique.

32. A method as in claim 31 wherein said depositing a ruthenium thin film on said plasma-treated substrate surface comprises:
using an ALD technique.

33. A method as in claim 14 wherein said depositing a ruthenium thin film comprises depositing a thin film containing substantially ruthenium atoms.

34. A method as in claim 14 wherein said depositing a ruthenium thin film comprises depositing a thin film containing substantially ruthenium oxide.

35. A method as in claim 14 wherein said exposing said dielectric layer to said excited iodine species is conducted at low pressure.

36. A method as in claim 14 wherein said depositing a ruthenium thin film on said plasma-treated dielectric layer comprises:
depositing an ultra-thin ruthenium film having a thickness in a range of about from 1 nm to 20 nm.

37. A method of forming a conductive metal-containing integrated circuit structure, comprising processes of:
providing a substrate having an untreated substrate surface;
providing a precursor of a surfactant species, said surfactant species selected from the group consisting of iodine, lead, tin, gallium, and indium;
generating a plasma discharge to create an excited surfactant species from said precursor;
exposing said untreated substrate surface to said excited surfactant species to form a plasma-treated substrate surface;
then depositing a ruthenium thin film on said plasma-treated substrate surface using a CVD technique; and
depositing a second metal layer on said ruthenium thin film.

38. A method as in claim 37 wherein said depositing a second metal layer on said ruthenium thin film comprises:
depositing a metal selected from the group consisting of copper, aluminum, titanium, and tungsten.

39. A method as in claim 37 wherein said depositing a second metal layer on said ruthenium thin film comprises:
electroplating copper on said ruthenium thin film.

40. A method as in claim 37 wherein said depositing a ruthenium thin film comprises:
depositing an ultra-thin ruthenium film having a thickness in a range of about from 1 nm to 20 nm.

41. A method of slowing the deposition of ruthenium on an integrated circuit substrate, comprising:
providing a substrate having an untreated substrate surface;
providing a precursor of a surfactant species, said surfactant species selected from the group consisting of iodine, lead, tin, gallium, and indium;
generating a plasma discharge to create an excited surfactant species from said precursor;
exposing said untreated substrate surface to said excited surfactant species to form a plasma-treated substrate surface; and
then depositing ruthenium on said plasma-treated substrate surface using a CVD technique.

* * * * *